Figure 1:
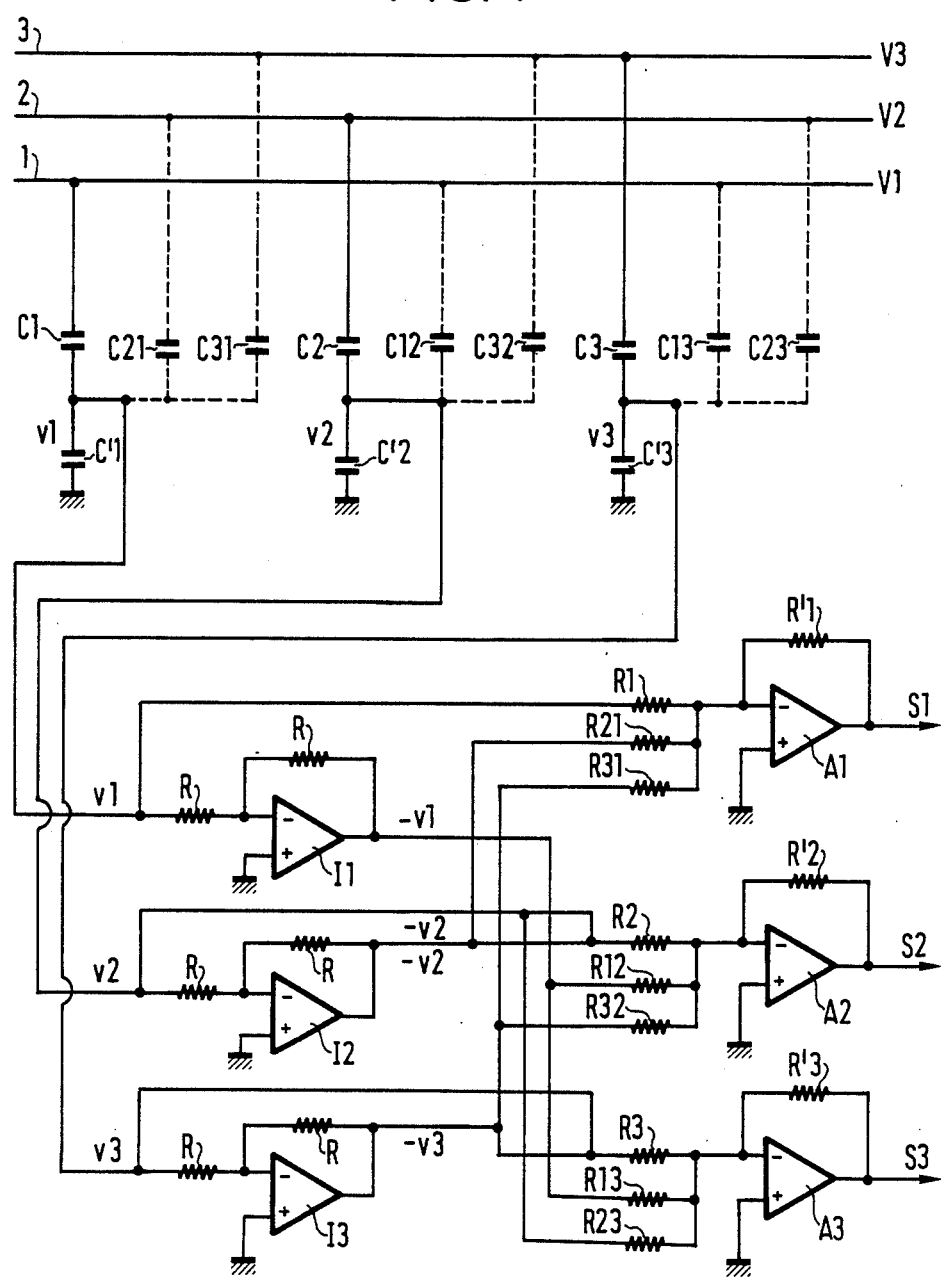

United States Patent [19]

Dupraz et al.

[11] Patent Number: 4,943,765
[45] Date of Patent: Jul. 24, 1990

[54] CIRCUIT FOR MEASURING VOLTAGES IN A THREE-PHASE INSTALLATION, IN PARTICULAR AN INSTALLATION OF THE METALCLAD TYPE

[75] Inventors: Jean-Pierre Dupraz, Lyons; Jean-Paul Moncorge, Vaux En Velin, both of France

[73] Assignee: GEC Alsthom SA, Paris, France

[21] Appl. No.: 401,375

[22] Filed: Aug. 31, 1989

[30] Foreign Application Priority Data

Sep. 9, 1988 [FR] France ............... 88 11793

[51] Int. Cl.$^5$ .......................... G01R 1/00; H02H 3/00
[52] U.S. Cl. ................................... 324/107; 326/126; 326/127; 326/142; 361/65; 361/86
[58] Field of Search .............. 324/126, 127, 107, 142; 361/86, 88, 65, 90; 364/483

[56] References Cited

U.S. PATENT DOCUMENTS

| | | | |
|---|---|---|---|
| 4,295,094 | 10/1981 | Wilreker et al. | 324/96 |
| 4,745,512 | 5/1988 | Hampson | 361/65 |
| 4,774,621 | 9/1988 | Andow | 361/86 |
| 4,802,053 | 1/1989 | Wojtah et al. | 361/86 |
| 4,862,076 | 8/1989 | Weihel | 324/107 |

FOREIGN PATENT DOCUMENTS 7408137  10/1974  France .

Primary Examiner—Reinhard J. Eisenzopf
Assistant Examiner—Vinh P. Nguyen
Attorney, Agent, or Firm—Sughrue, Mion, Zinn, Macpeak & Seas

[57] ABSTRACT

A circuit for measuring voltages in a three-phase installation, in particular an installation of the metalclad type, the circuit including for each of the phase conductors: a capacitive divider including a first capacitor connected firstly to said conductor and secondly to a second capacitor (C1, C2, C3) connected to ground, the circuit being characterized in that the voltage (v1, v2, v3) of each of the second capacitors (C'1, C'2, C'3) of the dividers is respectively applied firstly to the input of an inverter (I1, I2, I3) and secondly via a first resistance (R1, R2, R3) to the negative input of an operation amplifier (A1, A2, A3) which is also connected via second and third resistances (R21, R12, R13, and R31, R32, R23).

4 Claims, 2 Drawing Sheets

CIRCUIT FOR MEASURING VOLTAGES IN A THREE-PHASE INSTALLATION, IN PARTICULAR AN INSTALLATION OF THE METALCLAD TYPE

The present invention relates to a circuit for measuring voltage and suitable for use with a three-phase metalclad unit. In such a unit, equipment on the three phases is housed in a common casing. If it is desired to measure voltages by means of capacitive voltage dividers, then the measurement of a given phase is influenced by stray capacitance relative to the other phases.

This state of affairs is illustrated in the figure where references 1, 2, and 3 represent the three conducting bars of a three-phase metalclad installation at respective voltages V1, V2, and V3.

Capacitances C1, C'1; C2, C'2; and C3, C'3 represent the capacitors of three conventional capacitive dividers.

The voltages v1, v2, and v3 appearing at the terminals of C'1, C'2, and C'3 constitute respective images of the voltages to be measured.

The voltages v1, v2, and v3 are not accurately proportional to V1, V2, and V3 because of stray capacitances C21, C31 on phase 1, C12, C32 on phase 2, and C13, C23 on phase 3.

On the contrary, the measured voltages v1, v2, and v3 have the form:

$v1 = K1\ V1 + K21\ V2 + K31\ V3$
$v2 = K21\ V1 + K2\ V2 + K32\ V3$
$v3 = K31\ V1 + K32\ V2 + K3\ V3$

An object of the present invention is to extend the measurement circuit by adding a circuit for processing each of the voltages v1, v2, and v3 in such a manner as to enable output signals S1, S2, and S3 to be obtained which are proportional to the voltages to be measured.

The prior art is illustrated by French patent document FR-A-No. 2 221 737 which describes a circuit for correcting mutual inductances. In this circuit, the zero adjustment of one phase has an effect on the zero of the other two phases.

An object of the present invention is to provide a voltage measuring circuit in which the adjustments for correcting mutual inductances are independent for the three outputs.

The present invention thus provides a circuit for measuring voltages in a three-phase installation, in particular an installation of the metalclad type, the circuit comprising for each of the phase conductors: a capacitive divider comprising a first capacitor connected firstly to said conductor and secondly to a second capacitor connected to ground, the circuit being characterized in that the voltage of each of the second capacitors of the dividers is respectively applied firstly to the input of an inverter and secondly via a first resistance to the negative input of an operational amplifier which is also connected via second and third resistances respectively to the outputs of the inverters on the other two phases, with the resistances being selected in such a manner that when only one of the phases is under tension, then the output voltages from the operational amplifiers corresponding to the other phases are zero, with the output voltages from the amplifiers being, after said adjustment, respectively proportional to the voltages of the conductors.

Figure 2:
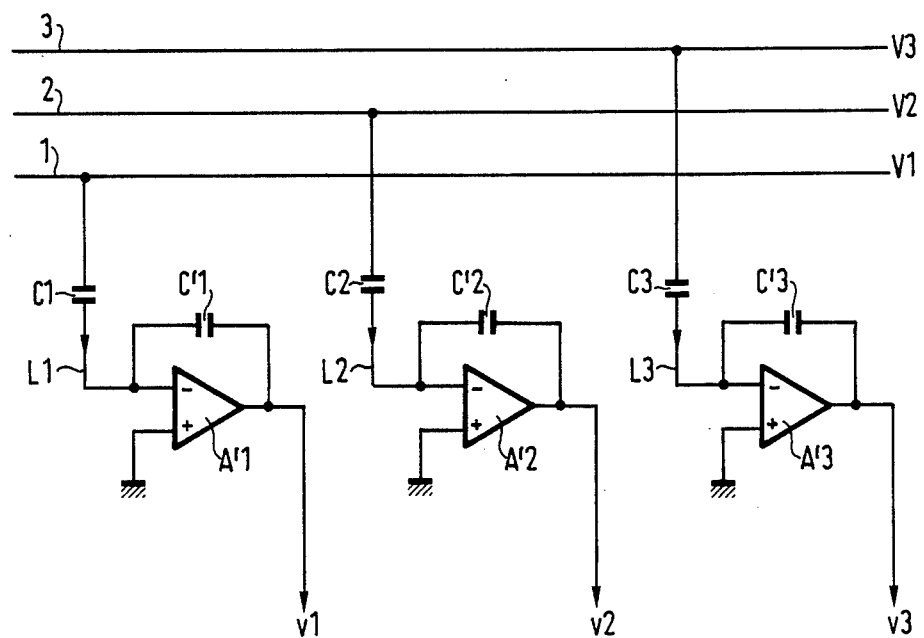

The invention will be well understood from the following description given with reference to the accompanying drawing, in which:

FIG. 1 is a diagram showing a first embodiment of a circuit of the invention; and FIG. 2 is a diagram showing a fragment of a variant.

At the top of FIG. 1, there can be seen a conventional circuit in which measurement is performed by capacitive voltage dividers as described in the introduction.

Each of the output voltages v1, v2, and v3 is connected to the negative input of an operational amplifier (I1, I2, I3) connected as an inverter by means of an input resistance of value R and a feedback resistance of the same value.

The output voltage −v1 from inverter I1 is applied via a resistance of value R1 to the negative input of an operational amplifier A1 having a feedback resistance of value R'1.

In addition, the negative input of amplifier A1 is connected to the outputs of inverters I2 and I3 via respective resistances of values R21 and R31.

The output signal from the amplifier A1 is designated by S1.

In similar manner, the output voltage −v2 from inverter I2 is applied via a resistance of value R2 to the negative input of an operational amplifier A2 provided with a feedback resistance of value R'2.

The negative input of amplifier A2 is connected to the outputs of connectors I1 and I3 via respective resistances of values R12 and R32. The output signal from the amplifier A2 is designated S2.

Finally, the output voltage −v3 from inverter I3 is applied via a resistance of value R3 to the negative input of an operational amplifier A3 provided with a feedback resistance R'3 The negative input of the amplifier A3 is connected to the outputs of the inverters I2 and I3 via respective resistances R13 and R23. The output signal from the amplifier A3 is designated S3.

The values of the resistances may be adjusted, for example, as follows:

Bar 1 is put under tension while bars 2 and 3 are at zero voltage. R12 is adjusted so that the signal S2 becomes zero. R13 is adjusted so that the signal S3 becomes zero.

The operation is repeated with bar 2 being the only bar under tension, thereby enabling R21 and R23 to be adjusted, and then with bar 3 being the only bar under tension to adjust R31 and R32.

After this adjustment, the following equations hold:

$S1 = k1\ V1$
$S2 = k2\ V2$
$S3 = k3\ V3$ in which k1, k2, and k3 are constants.

The effect of the stray capacitances has thus been eliminated.

The fact that inverting amplifiers I1, I2, and I3 are used makes it possible to use the type of circuit described above and solve the problem posed.

FIG. 2 shows a variant circuit in which the conventional capacitive divider is constituted in each phase by a respective first capacitor C1, C2, or C3 connected in series with an operational amplifier A'1, A'2, or A'3 connected as an integrator, i.e. having a second capacitor C'1, C'2, or C'3 connected between its negative input terminal and its output. The remainder of the circuit is unchanged.

In this case:

$v1 = -(C'1/C1)V1$
$v2 = -(C'2/C2)V2$
$v3 = -(C'3/C3)V3$

Merely by including integrating amplifiers A′1, A′2, and A′3, it is possible to measure voltage by amplifying the currents i1, i2, and i3 flowing through C1, C2, and C3.

We claim:

1. A circuit for measuring voltages in a three-phase installation, in particular an installation of the metalclad type, the circuit comprising for each of the phase conductors: a capacitive divider comprising a first capacitor connected firstly to, said conductor and secondly to a second capacitor (C′1, C′2, C′3) connected to ground, the circuit being characterized in that the voltage (v1, v2, v3) of each of the second capacitors (C′1, C′2, C′3) of the dividers is respectively applied firstly to the input of an inverter (I1, I2, I3) and secondly via a first resistance (R1, R2, R3) to the negative input of an operational amplifier (A1, A2, A3) which is also connected via second and third resistances (R21, R12, R13, and R31, R32, R23) respectively to the outputs of the inverters on the other two phases, with the resistances being selected in such a manner that when only one of the phases is under tension, then the output voltages from the operational amplifiers corresponding to the other phases are zero, with the output voltages from the amplifiers (A1, A2, A3) being, after said adjustment, respectively proportional to the voltages of the conductors.

2. A circuit according to claim 1, characterized in that the inverters (I1, I2, I3) are operational amplifiers connected as inverters.

3. A circuit for measuring voltages in a three-phase installation, in particular an installation of the metalclad type, the circuits comprising, for each phase, a first capacitor (C1, C2, C3) connected firstly to said conductor, the circuit being characterized in that said first capacitor is secondly connected to an operational amplifier (A′2, A′2, A′3) connected as an integrator with a second capacitor (C′1, C′2, C′3), the circuit being characterized in that the output voltage (v1, v2, v3) from each of said amplifiers connected as an integrator (A′1, A′2, A′3) is respectively applied firstly to the input of an inverter (I1, I2, I3) and secondly via a first resistance (R1, R2, R3) to the negative input of an operational amplifier (A1, A2, A3) which is also connected via second and third resistances (R21, R12, R13, and R31, R32, R23) respectively to the outputs of the inverters on the other two phases, with the resistances being selected in such a manner that when only one of the phases is under tension, then the output voltages from the operational amplifiers corresponding to the other phases are zero, with the output voltages from the amplifiers (A1, A2, A3) being, after said adjustment, respectively proportional to the voltages of the conductors.

4. A circuit according to claim 2, characterized in that the inverters (I1, I2, I3) are operational amplifiers connected as inverters.

* * * * *